United States Patent
Era et al.

(10) Patent No.: US 9,478,418 B2
(45) Date of Patent: Oct. 25, 2016

(54) METHOD OF MANUFACTURING SEMICONDUCTOR ELEMENT

(71) Applicant: Mitsubishi Electric Corporation, Tokyo (JP)

(72) Inventors: Atsushi Era, Tokyo (JP); Akihito Ohno, Tokyo (JP); Takahiro Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/641,202

(22) Filed: Mar. 6, 2015

(65) Prior Publication Data
US 2015/0348780 A1    Dec. 3, 2015

(30) Foreign Application Priority Data
May 28, 2014    (JP) .................................. 2014-110127

(51) Int. Cl.
| | | |
|---|---|---|
| *H01L 21/338* | (2006.01) | |
| *H01L 21/02* | (2006.01) | |
| *H01L 29/66* | (2006.01) | |
| *H01L 29/778* | (2006.01) | |
| *H01L 29/207* | (2006.01) | |

(52) U.S. Cl.
CPC ..... *H01L 21/02458* (2013.01); *H01L 21/0254* (2013.01); *H01L 21/0262* (2013.01); *H01L 21/02378* (2013.01); *H01L 21/02502* (2013.01); *H01L 21/02581* (2013.01); *H01L 29/66462* (2013.01); *H01L 29/7786* (2013.01); *H01L 29/207* (2013.01)

(58) Field of Classification Search
CPC .................... H01L 21/0254; H01L 21/02538; H01L 21/02581; H01L 21/02458; H01L 29/2003; H01L 29/201; H01L 29/207; H01L 31/03042; H01L 31/03044; H01L 31/03048; H01L 31/184; H01L 31/1844
See application file for complete search history.

(56) References Cited

U.S. PATENT DOCUMENTS

| | | | |
|---|---|---|---|
| 2008/0237610 A1* | 10/2008 | Imanishi ........... | H01L 21/02378 257/77 |
| 2010/0289067 A1* | 11/2010 | Mishra ................ | H01L 29/2003 257/268 |
| 2011/0037101 A1* | 2/2011 | Nakazawa .......... | H01L 27/0605 257/192 |

(Continued)

FOREIGN PATENT DOCUMENTS

| | | |
|---|---|---|
| JP | S63-229812 A | 9/1988 |
| JP | 2006-135274 A | 5/2006 |

(Continued)

*Primary Examiner* — Zandra Smith
*Assistant Examiner* — Evan Clinton
(74) *Attorney, Agent, or Firm* — Studebaker & Brackett PC

(57) ABSTRACT

A method of manufacturing a semiconductor element includes a first step of epitaxially growing an AlN layer on a substrate, a second step of forming a buffer layer on the AlN layer by epitaxially growing $Al_xGa_yIn_zN$ where x, y, and z satisfy x+y+z=1 and y is not zero without adding Fe, a third step of forming a resistance layer on the buffer layer by epitaxially growing $Al_xGa_yIn_zN$ where x, y, and z satisfy x+y+z=1 and y is not zero while adding Fe, a step of epitaxially growing a channel layer on the resistance layer, a step of epitaxially growing an electron supply layer above the channel layer, and a step of forming an electrode above the electron supply layer.

10 Claims, 1 Drawing Sheet

(56) References Cited

U.S. PATENT DOCUMENTS

| | | |
|---|---|---|
| 2012/0299059 A1 | 11/2012 | Takizawa et al. |
| 2013/0075786 A1* | 3/2013 | Ishiguro .............. H01L 29/7783 257/194 |
| 2014/0252368 A1* | 9/2014 | Lee ..................... H01L 29/7787 257/76 |
| 2015/0021660 A1* | 1/2015 | Chen ................. H01L 29/66462 257/190 |

FOREIGN PATENT DOCUMENTS

| | | |
|---|---|---|
| JP | 2011-204891 A | 10/2011 |
| JP | 2013-012767 A | 1/2013 |

* cited by examiner

METHOD OF MANUFACTURING SEMICONDUCTOR ELEMENT

BACKGROUND OF THE INVENTION

1. Field of the Invention

The present invention relates to a method of manufacturing a semiconductor element used in the field of electronics and optoelectronics for example.

2. Background Art

AlGaInN has a wide bandgap and is therefore used as a material for semiconductor elements of a high withstand voltage and semiconductor elements capable of emitting light of short wavelengths. AlGaInN is epitaxially grown on a substrate formed of sapphire, SiC or Si by metal organic chemical vapor deposition (MOCVD). As the substrate, SiC that highly lattice—matches to GaN and has high heat conductivity is ordinarily used.

Japanese Patent Laid-Open No. 2013-012767 discloses a chemical compound semiconductor device having an AlN layer epitaxially grown on a substrate and a nitride semiconductor layer epitaxially grown on the AlN layer, irregularities in the interface between the AlN layer and the nitride semiconductor layer being larger than those in the interface between the substrate and the AlN layer.

Increasing irregularities in the interface causes an apprehension of an increase in leak current. Therefore, the art disclosed in Japanese Patent Laid-Open No. 2013-012767 includes forming an AlGaN layer or a GaN layer having Fe added thereto (doped with Fe) between the AlN layer and the nitride semiconductor layer.

In the case of limiting the leak current by AlGaN, however, there is a need to select x satisfying $0 < x \leq 0.1$ for $Al_xGa_{1-x}N$ in order to avoid reducing the heat conductivity. With a layer of such a low Al composition ratio, a sufficiently high resistance value cannot be obtained. That is, the leak current cannot be controlled with AlGaN.

In the case where a GaN layer to which Fe is added is formed between the AlN layer and the nitride semiconductor layer, the GaN layer has a high resistance since n-type carriers can be compensated with Fe, thereby enabling leak current control. However, the GaN layer to which Fe is added has increased crystal grain boundaries and has its surface roughened, since irregularities exist in the surface of AlN layer, and since the GaN layer to which Fe is added can easily grow three-dimensionally. The crystal grain boundaries become dislocations and cause degradation of the crystallinity of a portion including the channel layer, thereby reducing the output and withstand voltage of the semiconductor element. Roughening of the surface means that surface opacity is easily caused by a change in an epi-condition with a slight environmental change such as in a chamber. That is, a margin of the epi-condition is considerably small.

SUMMARY OF THE INVENTION

In view of the above-described problem, an object of the present invention is to provide a semiconductor element manufacturing method which enables reducing a leak current and reducing crystal grain boundaries and surface roughness.

The features and advantages of the present invention may be summarized as follows.

According to one aspect of the present invention, a method of manufacturing a semiconductor element includes a first step of epitaxially growing an AlN layer on a substrate, a second step of forming a buffer layer on the AlN layer by epitaxially growing $Al_xGa_yIn_zN$ where x, y, and z satisfy $x+y+z=1$ and y is not zero without adding Fe, a third step of forming a resistance layer on the buffer layer by epitaxially growing $Al_xGa_yIn_zN$ where x, y, and z satisfy $x+y+z=1$ and y is not zero while adding Fe, a step of epitaxially growing a channel layer on the resistance layer, a step of epitaxially growing an electron supply layer above the channel layer, and a step of forming an electrode above the electron supply layer.

According to another aspect of the present invention, a method of manufacturing a semiconductor element includes a first step of epitaxially growing an AlN layer on a substrate, a second step of forming a buffer layer on the AlN layer by epitaxially growing $Al_xGa_yIn_zN$ where x, y, and z satisfy $x+y+z=1$ and y is not zero while adding Fe, a third step of forming a resistance layer on the buffer layer by epitaxially growing $Al_xGa_yIn_zN$ where x, y, and z satisfy $x+y+z=1$ and y is not zero while adding Fe, a step of epitaxially growing a channel layer on the resistance layer, a step of epitaxially growing an electron supply layer above the channel layer, and a step of forming an electrode above the electron supply layer, wherein the concentration of Fe added to the buffer layer in the second step is lower than the concentration of Fe added to the resistance layer in the third step.

According to another aspect of the present invention, a method of manufacturing a semiconductor element includes a first step of epitaxially growing an AlN layer on a substrate, a step of forming a strain reducing layer on the AlN layer by epitaxially growing $Al_xGa_{1-x}N$ where x is larger than 0 and smaller than 1 without adding Fe, a second step of forming a buffer layer on the strain reducing layer by epitaxially growing $Al_xGa_yIn_zN$ where x, y, and z satisfy $x+y+z=1$ and y is not zero, a third step of forming a resistance layer on the buffer layer by epitaxially growing $Al_xGa_yIn_zN$ where x, y, and z satisfy $x+y+z=1$ and y is not zero while adding Fe, a step of epitaxially growing a channel layer on the resistance layer, a step of epitaxially growing an electron supply layer above the channel layer, and a step of forming an electrode above the electron supply layer, wherein a lattice constant of the strain reducing layer is a value between a lattice constant of the AlN layer and a lattice constant of the buffer layer.

Other and further objects, features and advantages of the invention will appear more fully from the following description.

DETAILED DESCRIPTION OF THE PREFERRED EMBODIMENTS

Figure 1:
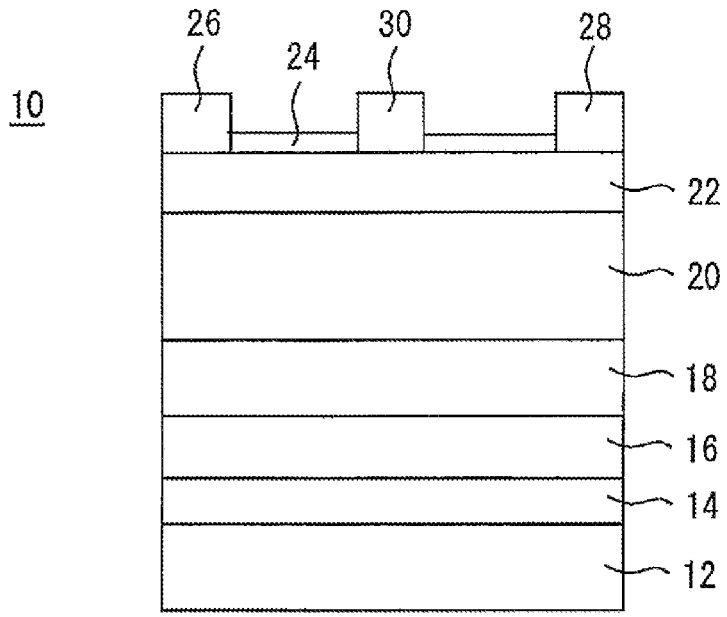
FIG. 1 is a sectional view of a semiconductor element according to a semiconductor element manufacturing method of first embodiment.

A semiconductor element manufacturing method according to an embodiment of the present invention will be described with reference to the drawings. Components identical or corresponding to each other are indicated by the same reference characters and repeated description for them is avoided in some cases.

First Embodiment

FIG. 1 is a sectional view of a semiconductor element 10 according to a semiconductor element manufacturing method according to a first embodiment of the present invention. The semiconductor element 10 forms a GaN-based high electron mobility transistor (HEMT). The semiconductor element 10 includes a substrate 12 formed of monocrystalline SiC. The substrate 12 may alternatively be formed of sapphire or Si. An AlN layer 14 is formed on the substrate 12.

A buffer layer 16 is formed on the AlN layer 14. A resistance layer 18 is formed on the buffer layer 16. The resistance layer 18 is formed for the purpose of controlling a leak current through the semiconductor element 10. A channel layer 20 is formed on the resistance layer 18. An electron supply layer 22 is formed on the channel layer 20. A source electrode 26, a drain electrode 28 and a gate electrode 30 are formed on the electron supply layer 22, with SiN protective film 24 interposed between the electrodes.

Figure 2:
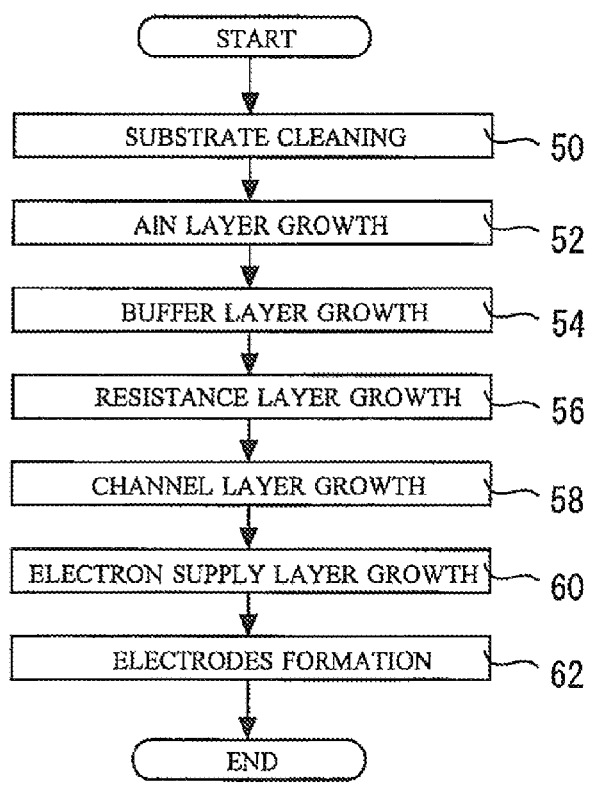
FIG. 2 is a flowchart showing a method of manufacturing the semiconductor element.

A method of manufacturing the semiconductor element 10 will be described. FIG. 2 is a flowchart showing a method of manufacturing the semiconductor element 10. First, the substrate 12 is cleaned (step 50). More specifically, the substrate 12 in a MOCVD apparatus is heated to a temperature of, for example, 1250° C. in a hydrogen atmosphere and maintained at this temperature for 30 minutes, thus cleaning the substrate 12 by heating and detaching natural oxide film or the like.

After the completion of step 50, the process advances to step 52. In step 52, the AlN layer 14 is epitaxially grown on the substrate 12. The growth conditions are, for example, a temperature of 1250° C. and a pressure of 50 millibar. It is preferable to set the thickness of the AlN layer 14 equal to or smaller than 50 nm in order to limit the reduction in drain current after shutoff of an alternating current signal and to secure recovery of the drain current in a short time after shutoff of the alternating current signal. The thickness of the AlN layer 14 is, for example, 30 nm. The AlN layer 14 functions as a nucleus forming layer. The step to form the AlN layer 14 is referred to as a first step.

After the completion of step 52, the process advances to step 54. In step 54, the buffer layer 16 is formed on the AlN layer 14. The buffer layer 16 is formed by epitaxially growing $Al_xGa_yIn_zN$. The sum of x, y, and z, i.e., x+y+z, is 1, and y is not zero. The growth conditions are, for example, a temperature of 1110° C. and a pressure of 200 millibar. The thickness of the buffer layer 16 is set to any value equal to or smaller than 150 nm, not particularly specified further. The thickness of the buffer layer 16 is, for example, 100 nm. The step to form the buffer layer 16 is referred to as a second step.

In the second step, no dopant gas for Fe is introduced into the chamber and, therefore, Fe is not added to the buffer layer 16. The word "addition" signifies that in a step a dopant is taken in a crystal grown in the step. Accordingly, non-addition of Fe in the buffer layer 16 means that no Fe exists in the buffer layer 16 immediately after the completion of the second step, not meaning that no Fe exists in the buffer layer 16 when the semiconductor element 10 is completed.

After the completion of step 54, the process advances to step 56. In step 56, the resistance layer 18 is formed on the buffer layer 16. The resistance layer 18 is formed by epitaxially growing $Al_xGa_yIn_zN$ while adding Fe. The sum of x, y, and z, i.e., x+y+z, is 1, and y is not zero. The growth conditions are, for example, a temperature of 1110° C. and a pressure of 200 millibar. For addition of Fe, a dopant gas such as ferrocene is supplied. The rate of this supply may be changed with respect to time. For example, the supply rate may be changed in such a manner that a small amount of dopant gas is first supplied and the amount of dopant gas to be supplied is increased with passage of time.

The thickness of the resistance layer 18 is set to any value in a range from 200 to 400 nm, not particularly specified further. The thickness of resistance layer 18 is, for example, 300 nm. In this step, Fe is added so that the concentration of Fe in the resistance layer 18 is within a range from $1 \times 10^{17}$ to $1 \times 10^{20}$ cm$^{-3}$. The concentration of Fe is more preferably $1 \times 10^{18}$ to $1 \times 10^{19}$ cm$^{-3}$. In this embodiment, $1 \times 10^{18}$ cm$^{-3}$ Fe is added to the resistance layer 18. The step to form the resistance layer 18 is referred to as a third step.

After the completion of step 56, the process advances to step 58. In step 58, the channel layer 20 is epitaxially grown on the resistance layer 18. The growth conditions are, for example, a temperature of 1110° C. and a pressure of 200 millibar. The channel layer 20 is, for example, a GaN layer having a thickness of 1 μm. The thickness of the channel layer 20 may be selected by considering the characteristics of HEMT and a warp of the substrate 12 for example. The thickness of the channel layer 20 is preferably 0.5 to 3 μm. No Fe is added to the channel layer 20.

After the completion of step 58, the process advances to step 60. In step 60, the electron supply layer 22 is epitaxially grown on the channel layer 20. The electron supply layer 22 is, for example, an AlGaN layer having a thickness of 25 nm. A concrete example of the composition of AlGaN is $Al_{0.2}Ga_{0.8}N$. The thickness and the composition of the electron supply layer 22, not limited to these examples, may be set as desired according to the performance of the HEMT required. No Fe is added to the electron supply layer 22.

After the completion of step 60, the process advances to step 62. In step 62, the SiN protective film 24 is first formed on the electron supply layer 22. Subsequently, patterning is performed on the SiN protective film 24 and the electron supply layer 22 is exposed. On the exposed electron supply layer 22, Ti/Al for example is deposited to form the source electrode 26 and the drain electrode 28, followed by annealing. Subsequently, patterning is performed on the SiN protective film 24 and the electron supply layer 22 is exposed. On the exposed electron supply layer 22, Ni/Au for example is deposited to form the gate electrode 30. In step 62, the electrodes (source electrode 26, drain electrode 28 and gate electrode 30) are formed on the electron supply layer 22.

In the semiconductor element manufacturing method according to the first embodiment of the present invention, the buffer layer 16 is formed on the AlN layer 14 "without adding Fe". Therefore, crystal grain boundaries and surface roughness can be reduced in comparison with a case where $Al_xGa_yIn_zN$ (x+y+z=1, y≠0) to which Fe is added is formed on the AlN layer 14.

With respect to the buffer layer 16 with no Fe added, there is an apprehension of a leak current through the interface between the buffer layer 16 and the AlN layer 14 (hereinafter referred to simply as "interface leak"). In order to control the interface leak, it is desirable to set the concentration of Fe at the interface to a value equal to or higher than $1 \times 10^{17}$ cm$^{-3}$. In the first embodiment of the present invention, part of Fe added to the resistance layer 18 in the third step is thermally diffused to the buffer layer 16 by heat accompanying the epitaxial growth till electrode forming, thereby increasing the Fe concentration in the buffer layer 16 to a value equal to or higher than $1 \times 10^{17}$ cm$^{-3}$. That is, with the epitaxial growth in steps 56, 58, and 60, Fe in the resistance layer 18 is thermally diffused to the buffer layer 16, and the buffer layer 16 contains Fe at $1 \times 10^{17}$ cm$^{-3}$ or higher when the semiconductor element 10 is completed. Thus, manufacture of the semiconductor element with a reduced leak current is made possible by control of the interface leak performed by setting the Fe concentration at the interface between the buffer layer 16 and the AlN layer 14 equal to or higher than $1 \times 10^{17}$ cm$^{-3}$.

Enabling Fe added to the resistance layer 18 to be thermally diffused so as to reach the interface between the buffer layer 16 and the AlN layer 14 requires reducing the thickness of the buffer layer 16 and increasing the Fe concentration in the resistance layer 18. In the first embodiment of the present invention, the thickness of the buffer layer 16 is set equal to or smaller than 150 nm, so that Fe added to the resistance layer 18 can reach the interface between the buffer layer 16 and the AlN layer 14. Further, the concentration of Fe added to the resistance layer 18 in the third step is set in the range from $1 \times 10^{17}$ to $1 \times 10^{20}$ cm$^{-3}$, thereby enabling a sufficient amount of Fe to reach the interface between the buffer layer 16 and the AlN layer 14. Thus, the interface leak can be reduced with reliability.

The resistance layer 18 is formed on the buffer layer 16, so that the thickness of the resistance layer and the concentration of Fe added to the resistance layer can be increased in comparison with the case where the resistance layer is formed on the AlN layer. However, there is a need to take care not to cause crystal grain boundaries and surface roughness by forming the resistance layer 18. In the first embodiment of the present invention, therefore, the thickness of the resistance layer 18 is set in the range from 200 to 400 nm and the concentration of Fe added to the resistance layer 18 is set to $1 \times 10^{17}$ to $1 \times 10^{20}$ cm$^{-3}$, thereby reducing crystal grain boundaries and surface roughness. That is, the upper limit of the thickness of the resistance layer 18 (400 nm) and the upper limit of the concentration of Fe added to the resistance layer 18 ($1 \times 10^{20}$ cm$^{-3}$) are set to such values that crystal grain boundaries and surface roughness can be reduced.

Various modifications can be made in the semiconductor element manufacturing method according to the first embodiment of the present invention. For example, a cap layer formed of a nitride semiconductor such as GaN may be provided on the electron supply layer 22. In such a case, the electrodes (source electrode 26, drain electrode 28 and gate electrode 30) are formed on the cap layer. That is, the electrodes may be formed above the electron supply layer 22 and may be in contact with the cap layer or the electron supply layer.

An insulating film may be provided between the electron supply layer 22 and the gate electrode 30 or between the cap layer and the gate electrode 30. The materials of the buffer layer 16, the resistance layer 18, the channel layer 20 and the electron supply layer 22 are not particularly specified as long as the material is as expressed by $Al_xGa_yIn_zN$ where x, y, and z satisfy x+y+z=1 and y is not zero. It is preferable to make the buffer layer 16 and the resistance layer 18 identical in composition to each other in order to equalize lattice constants.

A spacer layer having a bandgap larger than that of the electron supply layer may be provided between the channel layer 20 and the electron supply layer 22. A composition desirable as the composition of the spacer layer is selected from $Al_xGa_yIn_zN$ where x, y, and z satisfy x+y+z=1 and y is not zero. In the case of providing the spacer layer, the electron supply layer is formed on the spacer layer. That is, the electron supply layer may be formed above the channel layer and may be in contact with the spacer layer or the channel layer.

Since the AlN layer 14 and the buffer layer 16 have lattice constants different from each other, $Al_xGa_{1-x}N$ where x is a value larger than 0 and smaller than 1 may be formed as a strain reducing layer between the AlN layer 14 and the buffer layer 16. A lattice constant of the strain reducing layer is set to a value between the lattice constant of the AlN layer 14 and the lattice constant of the buffer layer 16. The strain reducing layer is epitaxially grown without adding Fe. In the case of providing the strain reducing layer, the buffer layer is formed on the strain reducing layer. That is, the buffer layer may be formed above the AlN layer and may be in contact with the strain reducing layer or the AlN layer.

In order to reduce the leak current through the interface between the strain reducing layer and the AlN layer 14, it is preferable to set the sum of the thickness of the strain reducing layer and the thickness of the buffer layer equal to or smaller than 150 nm. This enables part of Fe in the resistance layer to be thermally diffused to the buffer layer and the strain reducing layer to set the Fe concentrations in the strain reducing layer and the AlN layer 14 equal to or higher than $1 \times 10^{17}$ cm$^{-3}$, thus enabling setting the Fe concentration at the interface between the strain reducing layer and the AlN layer 14 equal to or higher than $1 \times 10^{17}$ cm$^{-3}$. Crystal grain boundaries and surface roughness can be reduced in the case of forming the strain reducing layer on the AlN layer 14 as well as in the case of forming the buffer layer 16 on the AlN layer 14.

Irregularities in the front surface of the AlN layer may be increased relative to those in the rear surface of the AlN layer, as disclosed in Japanese Patent Laid-Open No. 2013-012767. In such a case, the drain current can be recovered in a short time after shutoff of an alternating current signal, and the leak current, crystal grain boundaries and surface roughness can be reduced. These modifications can also be applied as desired to a semiconductor element manufacturing method according to an embodiment described below.

Second Embodiment

A semiconductor element manufacturing method according to the second embodiment corresponds in many respects to the first embodiment and will therefore be described mainly with respect to points of difference from the first embodiment. In the second step, the buffer layer 16 is epitaxially grown on the AlN layer 14 while adding Fe. The buffer layer 16 is $Al_xGa_yIn_zN$ where x, y, and z satisfy x+y+z=1 and y is not zero.

In the third step, the resistance layer 18 is epitaxially grown on the buffer layer 16 while adding Fe. The resistance layer 18 is $Al_xGa_yIn_zN$ where x, y, and z satisfy x+y+z=1 and y is not zero. The rate of flow of dopant gas supplied in the second step and the third step may be changed, for example, in such a manner that a small amount of dopant gas is first caused to flow and the flow rate is gradually increased.

The concentration of Fe added to the buffer layer 16 in the second step is set lower than the concentration of Fe added to the resistance layer 18 in the third step. The concentration of Fe added to the buffer layer 16 in the second step is, for example, lower than $1 \times 10^{17}$ cm$^{-3}$. The concentration of Fe added to the resistance layer 18 in the third step is, for example, $1 \times 10^{17}$ to $1 \times 10^{20}$ cm$^{-3}$.

The leak current reduction effect obtained with the buffer layer 16 can be improved by adding a minute amount of Fe to the buffer layer 16. Since the concentration of Fe added to the buffer layer 16 is low, crystal grain boundaries and surface roughness can be reduced.

According to the present invention, Fe is thermally diffused from a resistance layer on a buffer layer to the buffer layer on an AlN layer, thereby enabling reducing a leak current and reducing crystal grain boundaries and surface roughness in the semiconductor element.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor element, comprising:
a first step of epitaxially growing an AlN layer on a substrate;
a second step of forming a buffer layer on the AlN layer by epitaxially growing $Al_xGa_yIn_zN$ where x, y, and z satisfy x+y+z=1 and y is not zero, and x, y, and z remain the same throughout the buffer layer, wherein Fe is not added while the buffer layer is being formed;
a third step of forming a resistance layer on the buffer layer by epitaxially growing $Al_xGa_yIn_zN$ where x, y, and z satisfy x+y+z=1 and y is not zero, both the buffer layer and the resistance layer have the same composition, and x, y, and z remain the same throughout the resistance layer, wherein Fe is added while the resistance layer is being formed;
a step of epitaxially growing a channel layer on the resistance layer;
a step of epitaxially growing an electron supply layer above the channel layer; and
a step of forming an electrode above the electron supply layer,
wherein part of the Fe added to the resistance layer in the third step is thermally diffused to the buffer layer before forming of the electrode to increase the Fe concentration at an interface between the buffer layer and the AlN layer to a value equal to or higher than $1\times10^{17}$ $cm^{-3}$ to thereby reduce interface leak between the buffer layer and the AlN layer.

2. A method of manufacturing a semiconductor element, comprising:
a first step of epitaxially growing an AlN layer on a substrate;
a second step of forming a buffer layer on the AlN layer by epitaxially growing $Al_xGa_yIn_zN$ where x, y, and z satisfy x+y+z=1 and y is not zero, wherein Fe is added while the buffer layer is being formed;
a third step of forming a resistance layer on the buffer layer by epitaxially growing $Al_xGa_yIn_zN$ where x, y, and z satisfy x+y+z=1 and y is not zero, wherein Fe is added while the resistance layer is being formed;
a step of epitaxially growing a channel layer on the resistance layer;
a step of epitaxially growing an electron supply layer above the channel layer; and
a step of forming an electrode above the electron supply layer,
wherein the concentration of Fe added to the buffer layer in the second step is lower than the concentration of Fe added to the resistance layer in the third step, and
wherein part of the Fe added to the resistance layer in the third step is thermally diffused to the buffer layer before forming of the electrode to increase the Fe concentration at an interface between the buffer layer and the AlN layer to a value equal to or higher than $1\times10^{17}$ $cm^{-3}$ to thereby reduce interface leak between the buffer layer and the AlN layer.

3. The method according to claim 1, wherein the thickness of the resistance layer is 200 to 400 nm, and
wherein, in the third step, Fe is added so that the concentration of Fe in the resistance layer is in a range from $1\times10^{17}$ to $1\times10^{20}$ $cm^{-3}$.

4. The method according to claim 1, wherein the thickness of the buffer layer is equal to or smaller than 150 nm.

5. The method according to claim 1, wherein the substrate is monocrystalline SiC.

6. The method according to claim 1, wherein the AlN layer has irregularities in its front surface larger than those in its rear surface.

7. A method of manufacturing a semiconductor element, comprising:
a first step of epitaxially growing an AlN layer on a substrate;
a step of forming a strain reducing layer on the AlN layer by epitaxially growing $Al_xGa_{1-x}N$ where x is larger than 0 and smaller than 1 without adding Fe;
a second step of forming a buffer layer on the strain reducing layer by epitaxially growing $Al_xGa_yIn_zN$ where x, y, and z satisfy x+y+z=1 and y is not zero, and x, y, and z remain the same throughout the buffer layer;
a third step of forming a resistance layer on the buffer layer by epitaxially growing $Al_xGa_yIn_zN$ where x, y, and z satisfy x+y+z=1 and y is not zero, both the buffer layer and the resistance layer have the same composition, and x, y, and z remain the same throughout the resistance layer, wherein Fe is added while the resistance layer is being formed;
a step of epitaxially growing a channel layer on the resistance layer;
a step of epitaxially growing an electron supply layer above the channel layer; and
a step of forming an electrode above the electron supply layer,
wherein a lattice constant of the strain reducing layer is a value between a lattice constant of the AlN layer and a lattice constant of the buffer layer,
wherein part of the Fe added to the resistance layer in the third step is thermally diffused to the buffer layer and the strain reducing layer before forming of the electrode to increase the Fe concentration at an interface between the strain reducing layer and the AlN layer to a value equal to or higher than $1\times10^{17}$ $cm^{-3}$ to thereby reduce interface leak between the strain reducing layer and the AlN layer.

8. The method according to claim 7, wherein the sum of the thickness of the strain reducing layer and the thickness of the buffer layer is equal to or smaller than 150 nm.

9. The method according to claim 1, wherein both the buffer layer and the resistance layer are formed of GaN.

10. The method according to claim 7, wherein both the buffer layer and the resistance layer are formed of GaN.

* * * * *